US006272160B1

(12) United States Patent
Stronczer

(10) Patent No.: US 6,272,160 B1
(45) Date of Patent: Aug. 7, 2001

(54) HIGH-SPEED CMOS DRIVER FOR VERTICAL-CAVITY SURFACE-EMITTING LASERS

(75) Inventor: John J. Stronczer, Mattawan, MI (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/243,585

(22) Filed: Feb. 3, 1999

Related U.S. Application Data
(60) Provisional application No. 60/073,540, filed on Feb. 3, 1998.

(51) Int. Cl.[7] ........................................... H01S 3/00
(52) U.S. Cl. .................... 372/38.02; 372/38.03; 372/38.07
(58) Field of Search ............................ 372/38.02, 38.03, 372/38.07; 385/14; 359/152, 153; 315/209 R, 209 T, 219, 225

(56) References Cited

U.S. PATENT DOCUMENTS 5,796,767 * 8/1998 Aizawa ..................... 372/25
6,067,307 * 5/2000 Krishnamoorthy ................ 372/38

* cited by examiner

Primary Examiner—Frank G. Font
Assistant Examiner—Armando Rodriguez
(74) Attorney, Agent, or Firm—Gray Cary Ware Freidenrich

(57) ABSTRACT

High-speed driver circuits interface with and enhance the performance of vertical-cavity surface-emitting laser (VCSEL) diodes used within fiber optic communication systems, according to embodiments of the invention. A reference diode is formed from a first transistor, and a first current mirror sets a modulation current through the reference diode for driving a light-emitting device. A second current mirror sets a reference biasing current to maintain a constant bias of the reference diode. A first capacitor, charged by a differential amplifier and coupled to the reference diode, supplies complementary charge to the reference diode during differential input voltage transitions. Components of the driver circuit provide asymmetrical operation of the laser, allowing rapid light-emitting-device turn-on and turn-off.

21 Claims, 4 Drawing Sheets

HIGH-SPEED CMOS DRIVER FOR VERTICAL-CAVITY SURFACE-EMITTING LASERS

CROSS-REFERENCE TO RELATED APPLICATION

This application claims priority under 35 U.S.C. §119 to U.S. Provisional Patent Application No. 60/073,540, filed Feb. 3, 1998, which is incorporated herein by reference.

BACKGROUND OF THE INVENTION

1. Field of the Invention

This invention relates to fiber optic communication, and more particularly, to high-speed drivers for interfacing with and enhancing the performance of vertical-cavity surface-emitting laser (VCSEL) diodes used within fiber optic communication systems, as well as in other applications.

2. Description of Related Art

Optical transmission systems have three general components: the light source, the transmission medium, and the detector. Light sources for an optical transmission system are typically either Light Emitting Diodes (LEDs) or lasers. (Semiconductor lasers have distinct advantages over LEDs, including higher data rates and longer distance transmission capabilities.) Typically, a pulse of light from the light source indicates a one bit and the absence of light indicates a zero bit. The transmission medium is commonly ultra-thin glass fiber. The detector generates an electrical pulse when light falls upon it.

Low-cost, high-performance, highly integrated fiber optic interface circuits are becoming increasingly necessary to meet the demands of high-speed digital data communication. With the advent of gigabit Ethernet systems, for example, fiber optic technology has become increasingly preferred. A fiber optic transmission line preferably uses a VCSEL diode as the light source to transmit optical data. In contrast to edge-emitting lasers, VCSELs have a vertical optical cavity that is perpendicular to the epitaxial growth direction. Beams emitting from an edge-emitting laser are highly astigmatic, making them less desirable in high-speed digital data communication applications. VCSELs typically emit a circularly symmetric Gaussian beam which is very conducive to high-efficiency coupling into optical fiber.

The high-speed nature of fiber optic communication necessitates that the VCSEL diodes operate quickly, accurately and efficiently. To enhance the operation of the VCSEL diodes, new driver circuits designed specifically for the VCSEL diodes are needed. These new driver circuits need to address the speed demands of fiber optic communication systems, including the need for higher edge rates and integrated edge enhancement circuitry, low-voltage differential signaling input interfaces (LVDS), low overhead current requirement, good power supply rejection, low power supply requirement, optimization for common-cathode VCSEL connection, and multiple parallel driver integration.

A typical prior art driver circuit for a laser diode appears in FIG. 1. Transistors T10 and T15 make up the differential input circuit, using input ports 10 and 15. Included also are two current mirrors, the first being formed from transistors T20 and T25. This current mirror sets the first reference current, IRef1, from current source 20. The second current mirror, formed by transistors T30 and T35, sets the second reference current, IRef2, from current source 25.

As a result of this prior art configuration, the dc bias current is required to flow even when the laser is off. This requires a high overhead current supply, which is undesirable. Because burst-mode optical transmitters require lasers to be off more than they are on, this constant current consumption is inefficient. The constant current draw also discourages driving multiple common cathode connected VCSELs or integrating multiple parallel drivers for use with VCSEL arrays. The relatively high current demands of such configurations do not integrate well with the present low-power fiber optic communications systems, which typically incorporate LVDS interfaces.

Another limitation of the prior art circuit in FIG. 1 is that it contains no integrated edge-rate enhancement circuitry and no precise current controls. In FIG. 1, transistor T15 switches the drive current to the laser diode. Gate-drain parasitic capacitance of transistor T15 typically results in voltage spiking that can drive the laser to emit light longer than it should, causing "overshoot" and thus undesirably limiting the efficiency and speed with which the VCSEL can operate.

Yet another limitation of the prior art circuit in FIG. 1 is that it has a narrow range of available driving current, which undesirably restricts its adaptability to drive VCSELs having different current requirements. This limitation further restricts using a plurality of common cathode connected VCSELs and further limits multiple parallel driver integration.

Still another limitation of previous laser driver circuits is common anode connection. Common anode driving of VCSELs can be undesirable because contact with a common anode-connected VCSEL can cause a harmful electrical discharge. Not only can this pose a safety risk, but also damage to the VCSEL and related circuitry may result.

There is a need in the industry for a driver circuit for a VCSEL diode that is cost-effective, safe, and preferably fabricated with complementary metal oxide semiconductor (CMOS) technology, while at the same time addresses the problems of typical driver circuits as outlined above.

SUMMARY OF THE INVENTION

Driver circuits according to the embodiments of the invention substantially meet the above-described needs of the industry.

An object of the present invention is to provide a light transceiver circuit having a driver, fabricated in low-cost CMOS integrated circuit technology, for interfacing with and enhancing the performance of a VCSEL diode.

Another object of the present invention is to provide a driver circuit with an improved driver edge-rate, preferably less than 250 pS.

Still another object of the present invention is to provide a VCSEL diode driver circuit responsive to an LVDS input interface.

Yet another object of the present invention is to provide precision on-chip control of the modulation and bias currents.

Another object of the present invention is to provide a driver circuit that requires low overhead supply current, preferably less than 10 mA.

Still another object of the present invention is to provide a driver circuit that requires a low supply voltage, preferably less than five volts.

Another object of the invention is to provide integrated adjustable negative charge peaking, and integrated edge rate enhancement circuitry to promote fast laser turn-off and turn-on.

Yet another object of the invention is to provide common cathode connection for the light-emitting device with a single ground plane for safety, and a more reliable design.

DETAILED DESCRIPTION OF PREFERRED EMBODIMENTS

Figure 1:
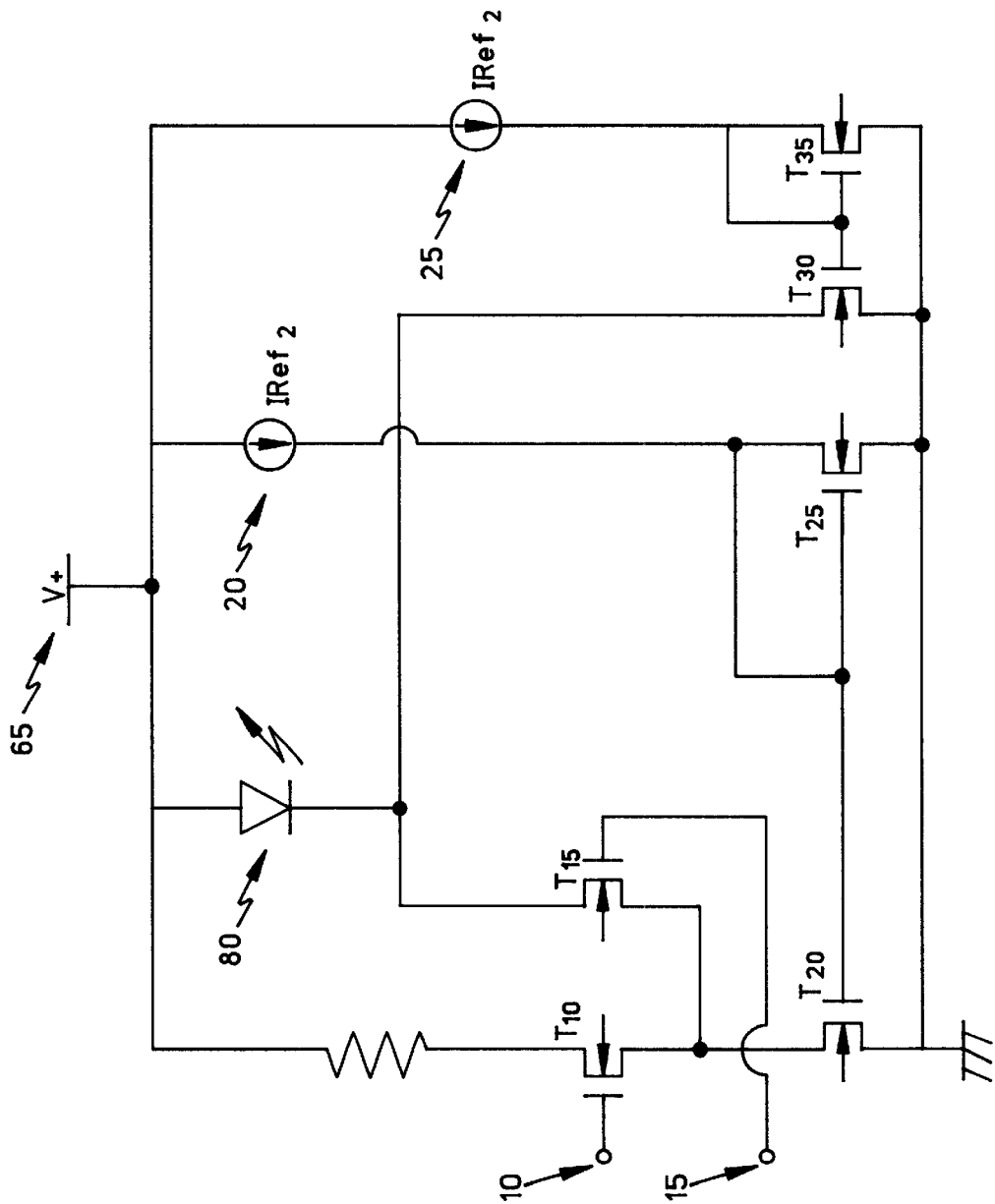
FIG. 1 is a schematic diagram of a typical prior art driver circuit.
Figure 2:
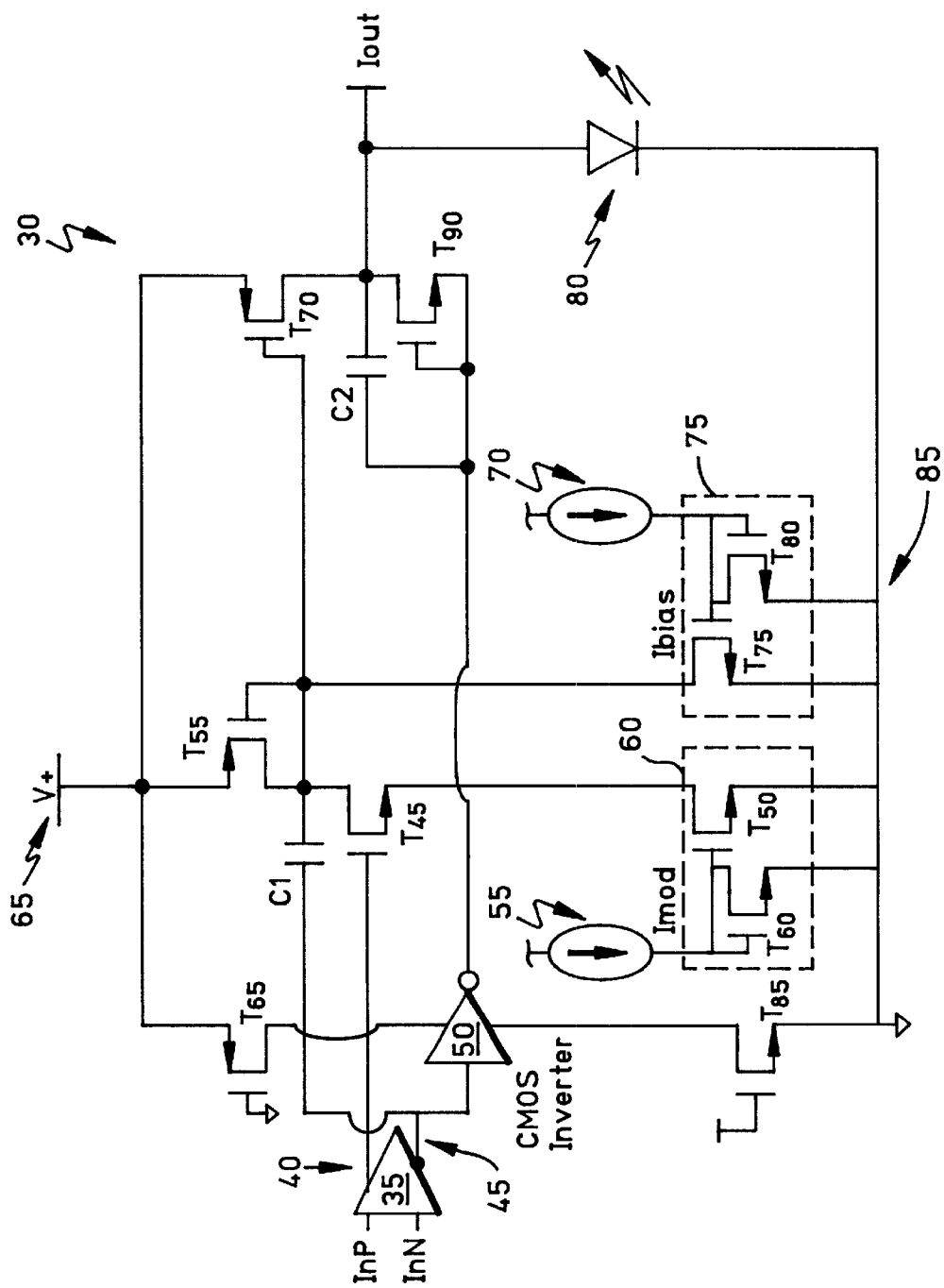
FIG. 2 is a schematic diagram of a driver circuit for use with a VCSEL diode according to an embodiment of the present invention.

Referring to FIG. 2, one embodiment of a driver circuit 30 for use with VCSEL diodes according to the present invention may be appreciated. A differential input, typically representing data to be transmitted, is received at ports InP and InN of differential amplifier 35. The non-inverted output 40 of amplifier 35 is connected to the gate of transistor T45. The inverted output 45 of amplifier 35 is connected to inverter 50. Inverted output 45 also charges capacitor C1.

The source of transistor T45 is connected to the drain of transistor T50, while the drain of transistor T45 is connected to the drain of transistor T55. The gate of transistor T50 is connected to Imod current source 55 and to the drain of transistor T60, while the source of transistor T50 is connected to ground. Current source 55 is also connected to the gate of transistor T60, and the source of transistor T60 is connected to ground. Transistors T50 and T60 make up current mirror 60, the purpose of which is to generate a stable and predictable dc reference current for biasing various transistors in the circuit.

The source of transistor T55 is connected to voltage supply 65, to the source of transistor T65, and to the source of transistor T70. The gate of transistor T65 is connected to ground. The gate of transistor T55 is connected to the gate of transistor T70 and to the drain of transistor T75. The source of transistor T75 is connected to ground, and the gate of transistor T75 is connected to Ibias current source 70 and the drain of transistor T80. Ibias current source 70 is further connected to the gate of transistor T80. The source of transistor T45 is connected to current mirror 60.

Transistors T75 and T80 make up current mirror 75. Current mirror 75 maintains a constant bias of transistor T55 and transistor T70. The drain of transistor T65 is connected to inverter 50, as is the drain of transistor T85. The source of transistor T85 is connected to ground, and the gate of transistor T85 is connected to voltage supply V+65. Capacitor C1 is connected between the input of inverter 50 on one side, and the drain of transistor T55 and drain of transistor T45 on the other. The output of inverter 50 is connected to capacitor C2 and the gate and the source of transistor T90. Capacitor C2 is also connected to the drains of transistors T70 and T90 and to current output, Iout. Capacitor C2 is further connected to the source and drain of transistor T90 and to the anode of diode 80. The cathode of diode 80, as well as the sources of transistors T50, T60, T75, T80, and T85, are connected directly to single ground plane 85.

The operation of driver circuit 30 may be described as follows. The differential input is received at ports InP and InN of amplifier 35, whereby a voltage output is produced. This voltage output is converted to modulation current, Imod, by switching of a reference current, set by the current mirror 60, through the reference threshold voltage of a reference diode formed of transistor T55. The reference threshold voltage of the reference diode (transistor T55) is formed when the gate of transistor T55 is connected to drain. Imod current is coupled through transistor T70 to diode 80, which is preferably a VCSEL diode.

A substantially constant Ibias current is set through current mirror 75 and maintains a substantially constant bias of transistors T55 and T70. Such biasing improves the turn-on speed of driver circuit 30. Capacitor C1 couples complementary charge into reference threshold voltage of the reference diode formed of transistor T55 when the differential input transitions from high-to-low or low-to-high, to improve the driver edge-rate. Further edge-rate improvement is provided through energy coupled through the combination of capacitor C2 and transistor T90. These devices provide an asymmetrical coupling of charge directly into light-emitting device 80. Positive current is coupled through transistor T90 and charges capacitor C2.

The charge in capacitor C2 is drained on the negative-going edge when the modulation current, Imod, is cut off. This asymmetrical operation provides the negative edge peaking to ensure more rapid laser turn-off, thereby reducing the effect of a turn-off "tail" that is often exhibited by VCSEL diodes in prior art circuits. Note that the speed and magnitude of the negative edge peaking is preferably controlled through adjustment of the effective resistance of transistors T85 and T65 as they enter the triode region of operation.

The combination of the edge and charge coupling provided by capacitors C1 and C2 and transistor T90 provides excellent edge characteristics in the laser light output of the VCSEL diode, opening the eye of the laser output waveform (see FIG. 4, described below) and advantageously reducing bit error rates for data transmission with bitrates in the Gbit/s range of operation. Driver circuit 30 advantageously accomplishes the desired edge characteristic without requiring external response-shaping circuitry that past drivers have required. Integration of the design ensures correct edge alignments and summing of the various charge and peaking effects without external adjustments upon assembly. Integration resolves many inherent matching problems encountered when constructing the circuit with discrete components.

Temperature, threshold, and slope efficiency compensation of diode 80 is accomplished with precision, preferably by setting bias and modulation current values with simple resistor and thermistor devices.

Embodiments of driver circuit 30 preferably are implemented entirely with a low-cost integrated circuit (IC) process. Ideally, driver circuit 30 is implemented using complementary metal oxide semiconductor (CMOS) technology. CMOS technology is a relatively low-cost IC process due to its present use in high-volume computer applications. Integration substantially ensures optimum time alignment of the edge rate enhancement features described above.

Driver circuit 30 preferably is optimized to allow both single and multiple common cathode connected VCSELs to be driven. This common cathode configuration is promoted by the single ground plane 85 configuration, as shown in FIG. 2.

Figure 3:
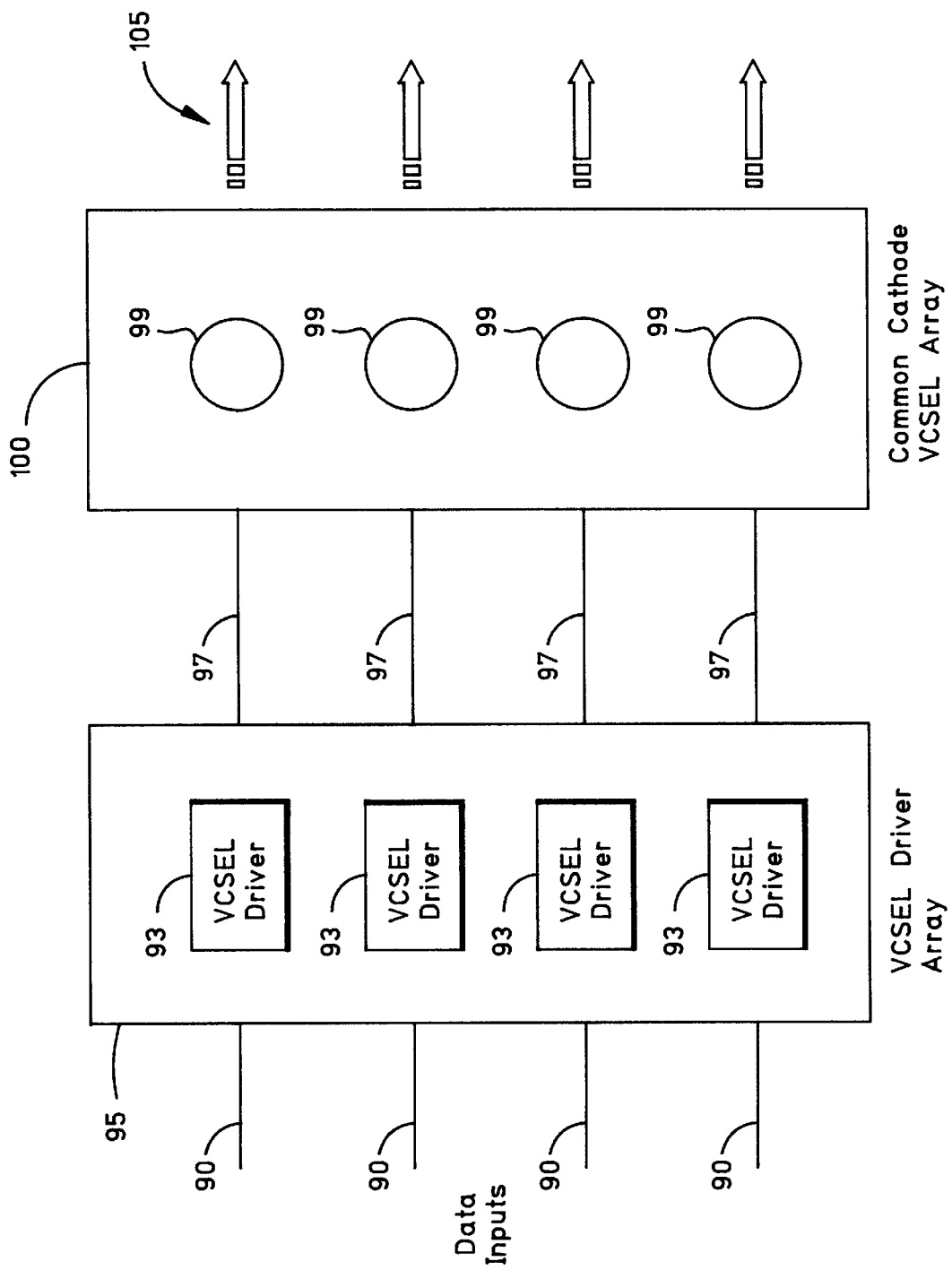
FIG. 3 is a block diagram showing an array of VCSEL drivers driving a common-cathode VCSEL array.

FIG. 3 is a block diagram of one preferred embodiment of the invention, showing an array of VCSEL drivers according to the invention, driving a common-cathode VCSEL array. Multiple data input lines 90 match to the individual driver circuits 93 in driver array 95. Driver output lines 97 match to a corresponding common-cathode VCSEL 99 in VCSEL array 100. Light emissions 105 result, matching the corresponding data input. With the growing popularity of VCSELs and the ability to construct VCSEL arrays, the ability to construct an array of drivers linked to an array of VCSELs is one important feature of the invention, among others.

Low overhead current and good power supply rejection of driver circuit 30 allow integration of multiple driver circuits 30 for use with VCSEL diode arrays, as shown in FIG. 3. Differential amplifier 35 (FIG. 2) provides good power supply rejection, reduced signal-to-noise ratios (SNR) and favorable slew rates.

Figure 4:
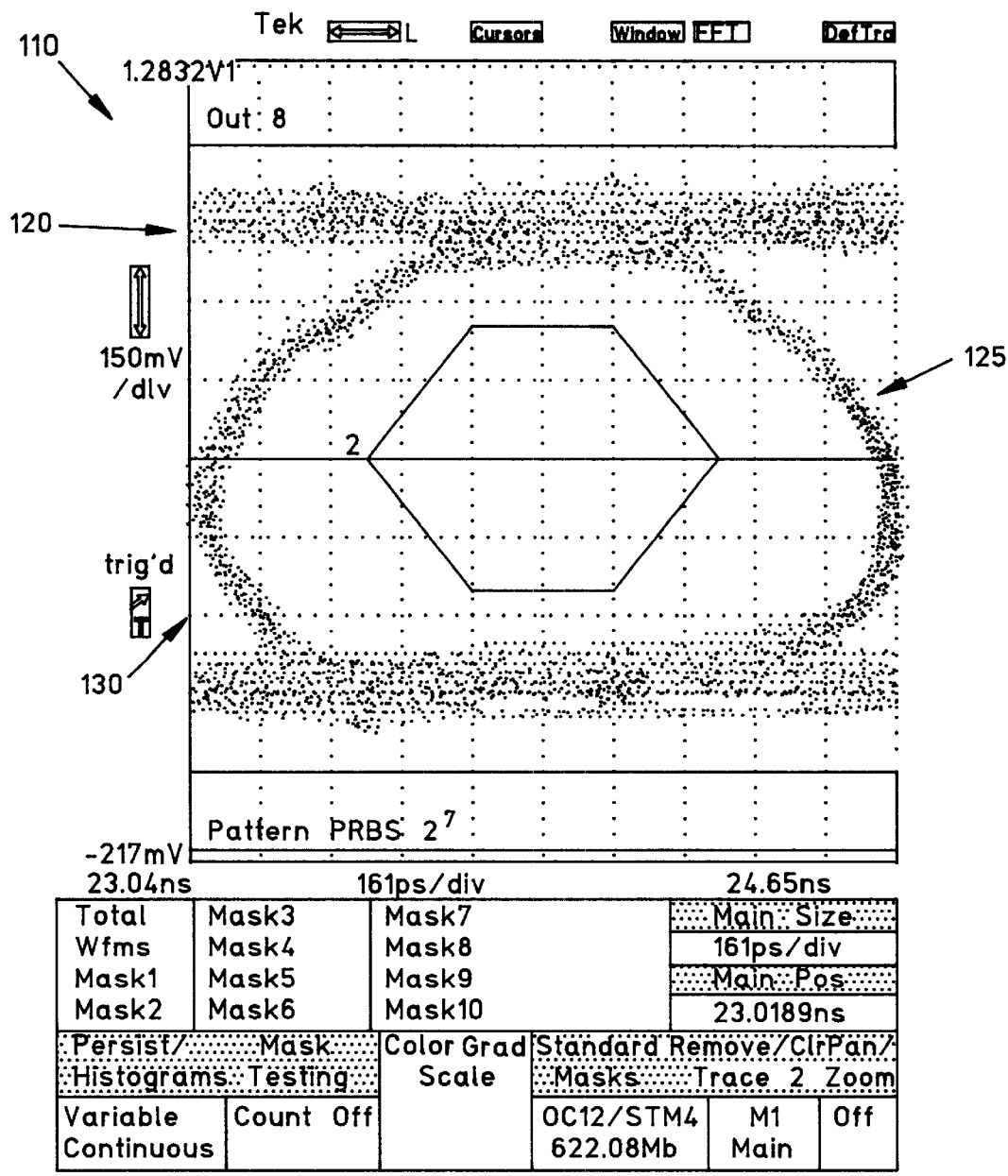
FIG. 4 is a digital sampling oscilloscope image of an output waveform from a preferred embodiment of the invention.

FIG. 4 is a digital sampling oscilloscope image of an output waveform 110 from a preferred embodiment of the present invention superimposed about an ideal waveform 111. The "open eye" waveform is a histogram of waveform data superimposed on each other to yield the "open eye". It is desired that the output waveform 110 be open and conform as closely as possible to the ideal waveform 111. The more open the eye, the better the data transmission. Advantageously, output 120 represents a lack of ringing. At waveform output portion 130, desired edge peaking is depicted, indicating clean laser turn-off. Waveform portion 125 illustrates the desirable high-edge rate obtained from the invention, needed for high-speed optical communication systems.

Each of the transistors used and described above may be a field-effect transistor (FET) such as a MOS transistor, a bipolar transistor, a gallium arsenide (GaAs) FET or other similar transistor, as long as it is capable of the corresponding function as described herein.

The specification is intended to be illustrative of the many variations and equivalents possible according to the invention. Various modifications in and changes to the above-described devices and methods will be apparent to those of ordinary skill. Though driver circuits were described with particularity for uses directed at high-speed fiber optic communications, other uses for such driver circuits are readily apparent to one of ordinary skill reading the specification. For example, VCSEL diodes have uses in myriad devices, such as bar code scanners, encoders, proximity sensors, laser printers, and laser range finders, among others.

What is claimed is:

1. A light transceiver circuit, comprising:
    a light-emitting device; and
    a driver circuit for driving the light-emitting device, the driver circuit comprising:
        a differential amplifier for receiving a differential voltage input;
        a reference diode formed from a first transistor;
        a first current mirror setting a modulation current through the reference diode for driving the light-emitting device;
        a second current mirror setting a reference biasing current to maintain a constant bias of the reference diode; and
        a first capacitor, charged by the differential amplifier and coupled to the reference diode, for supplying complementary charge to the reference diode during differential input voltage transitions.
2. The circuit of claim 1, further including:
    a second capacitor; and
    a second transistor, the second capacitor and the second transistor being operably coupled to the differential amplifier, the second transistor providing switching for positively charging the second capacitor and for discharging the second capacitor during modulation current cut-off.
3. The circuit of claim 2 wherein the first and second current mirrors share a single ground plane.
4. The circuit of claim 3 wherein the light-emitting device is connected in a common cathode configuration.
5. The circuit of claim 4 wherein a plurality of light-emitting devices are connected in a common cathode configuration.
6. The circuit of claim 1 wherein the light-emitting device is a VCSEL diode.
7. The circuit of claim 1, wherein the driver circuit is fabricated on a single integrated circuit (IC) chip.
8. The circuit of claim 7, wherein said single IC chip is fabricated with a CMOS process.
9. The circuit of claim 1 wherein a plurality of the driver circuits are connected in a parallel array, the parallel array driving an array of common cathode connected VCSELs.
10. A high-speed driver circuit for interfacing with and enhancing the performance of a vertical-cavity surface-emitting laser (VCSEL), the driver circuit being implemented on a single integrated circuit using CMOS technology, the driver circuit comprising components constructed and arranged to provide asymmetrical operation of the laser, to ensure rapid light-emitting device turn-off and turn-on.
11. The circuit of claim 10 wherein the components comprise negative edge peaking control components to promote fast laser turn-off, the negative edge peaking control components being operably coupled to the VCSEL.
12. The circuit of claim 11 wherein components providing edge and charge coupling of the VCSEL are operably coupled to the VCSEL to enhance waveform edge characteristics.
13. The circuit of claim 10 wherein the components that provide asymmetrical operation include a first capacitor coupled to a first transistor to drain charge from the laser on an out-going edge, and a second capacitor coupled to a reference diode to provide complementary charge during circuit input transitions.
14. A method of driving a light transceiver system, the method comprising:
    providing a light-emitting device and a driver circuit;
    receiving a differential voltage input;
    setting a modulation current through a reference diode for driving the light-emitting device;
    setting a reference biasing current to maintain a constant bias of the reference diode; and
    supplying a complementary charge to the reference diode during differential input voltage transitions.
15. The method of claim 14 further including:
    positively charging a capacitor and discharging a capacitor during modulation current cut-off.
16. The method of claim 15 further including:
    connecting first and second current mirrors to a single ground plane.
17. The method of claim 16 further including:
    connecting the light-emitting device in a common cathode configuration.
18. The method of claim 17 further including:
    connecting a plurality of light-emitting devices in a common cathode configuration.

19. The method of claim 14 further including:
forming the light-emitting device of a VCSEL.

20. The method of claim 14 further including:
forming the driver circuit on a single integrated circuit chip.

21. The method of claim 20 further including:
fabricating the single integrated circuit chip by a CMOS process.

* * * * *